(12) United States Patent
Nagaoka et al.

(10) Patent No.: US 11,214,117 B2
(45) Date of Patent: Jan. 4, 2022

(54) TEMPERATURE CONTROL SYSTEM FOR ELECTRIC VEHICLE AND METHOD OF CONTROLLING TEMPERATURE OF ELECTRIC VEHICLE

(71) Applicant: SUBARU CORPORATION, Tokyo (JP)

(72) Inventors: Nobusuke Nagaoka, Tokyo (JP); Yoshihiro Nakazato, Tokyo (JP); Taiki Sakai, Tokyo (JP); Yosuke Kubota, Tokyo (JP)

(73) Assignee: SUBARU CORPORATION, Tokyo (JP)

( * ) Notice: Subject to any disclaimer, the term of this patent is extended or adjusted under 35 U.S.C. 154(b) by 167 days.

(21) Appl. No.: 16/671,908

(22) Filed: Nov. 1, 2019

(65) Prior Publication Data

US 2020/0198437 A1    Jun. 25, 2020

(30) Foreign Application Priority Data

Dec. 20, 2018 (JP) .............................. JP2018-238151

(51) Int. Cl.
*B60H 1/00* (2006.01)
*B60L 1/00* (2006.01)
(Continued)

(52) U.S. Cl.
CPC ..... *B60H 1/00278* (2013.01); *B60H 1/00007* (2013.01); *B60H 1/00328* (2013.01);
(Continued)

(58) Field of Classification Search
CPC ............ B60H 1/00278; B60H 1/00007; B60H 1/00328; B60H 1/00392; B60H 1/00428;
(Continued)

(56) References Cited

U.S. PATENT DOCUMENTS

| 6,178,928 B1 * | 1/2001 | Corriveau | F01P 7/048 |
| | | | 123/41.12 |
| 7,823,671 B2 * | 11/2010 | Inoue | B60L 3/003 |
| | | | 180/68.4 |

(Continued)

FOREIGN PATENT DOCUMENTS

| JP | 2013-154755 A | 8/2013 |
| JP | 2017-165141 A | 9/2017 |

*Primary Examiner* — Davis D Hwu
(74) *Attorney, Agent, or Firm* — McDermott Will & Emery LLP

(57) ABSTRACT

A temperature control system to be installed in an electric vehicle includes a water circuit, a coolant circuit, a radiator, a heat exchanger, a water pump, and a controller. The water circuit circulates cooling water to cool an electric device. The coolant circuit circulates a coolant to control a temperature of a cabin or battery of the electric vehicle. The radiator is disposed in the water circuit. The heat exchanger is disposed in the coolant circuit and receives heat released from the radiator through cooling air delivered from the radiator. The water pump regulates a flow rate of the cooling water circulating in the water circuit. The controller increases the number of rotations of the water pump to a greater value in a condition where an increase in temperature of the cabin or the battery is requested than in a normal condition where the increase in temperature is not requested.

5 Claims, 2 Drawing Sheets

(51) Int. Cl.
*B60L 58/27* (2019.01)
*H05K 7/20* (2006.01)
*B60H 1/14* (2006.01)
*B60H 1/32* (2006.01)

(52) U.S. Cl.
CPC ..... *B60H 1/00392* (2013.01); *B60H 1/00428* (2013.01); *B60H 1/00457* (2013.01); *B60H 1/143* (2013.01); *B60H 1/32* (2013.01); *B60L 1/003* (2013.01); *B60L 58/27* (2019.02); *H05K 7/20881* (2013.01); *B60L 2270/46* (2013.01)

(58) Field of Classification Search
CPC ...... B60H 1/00457; B60H 1/143; B60H 1/32; B60L 58/27; B60L 1/003; B60L 2270/46; H05K 7/20881
USPC ........................................................ 165/202
See application file for complete search history.

(56) References Cited

U.S. PATENT DOCUMENTS

| 2014/0303835 | A1* | 10/2014 | VerWoert | B60H 1/00842 701/36 |
| 2016/0318499 | A1* | 11/2016 | Yamanaka | B60H 1/32284 |

\* cited by examiner

TEMPERATURE CONTROL SYSTEM FOR ELECTRIC VEHICLE AND METHOD OF CONTROLLING TEMPERATURE OF ELECTRIC VEHICLE

CROSS-REFERENCE TO RELATED APPLICATIONS

The present application claims priority from Japanese Patent Application No. 2018-238151 filed on Dec. 20, 2018, the entire contents of which are hereby incorporated by reference.

BACKGROUND

The disclosure relates to a temperature control system to be installed in an electric vehicle and a method of controlling the temperature of the electric vehicle.

Heating, ventilation, and air conditioning (HVAC) units have been known that control the temperature of a cabin or compartment of an electric vehicle. Some of the HVAC units control, in particular increase, the temperature of a battery of the electric vehicle. In some cases, the temperature of the cabin or the battery is requested to be rapidly increased when an increase in temperature of the cabin is requested by an occupant or when the temperature of the battery is low, for example.

SUMMARY

An aspect of the disclosure provides a temperature control system to be installed in an electric vehicle. The temperature control system includes a water circuit, a coolant circuit, a radiator, a heat exchanger, a water pump, and a controller. The water circuit is configured to circulate cooling water. The cooling water is configured to cool an electric device. The coolant circuit is configured to circulate a coolant. The coolant is configured to control a temperature of a cabin or a battery. The radiator is disposed in the water circuit. The heat exchanger is disposed in the coolant circuit and configured to receive heat released from the radiator through cooling air delivered from the radiator. The water pump is configured to regulate a flow rate of the cooling water circulating in the water circuit. The controller is configured to control the number of rotations of the water pump, and to increase the number of rotations of the water pump to a greater value in a condition where an increase in the temperature of the cabin or the battery is requested than in a normal condition where the increase in the temperature is not requested.

An aspect of the disclosure provides a temperature control system to be installed in an electric vehicle. The temperature control system includes a water circuit, a coolant circuit, a radiator, a heat exchanger, a radiator fan, and a controller. The water circuit is configured to circulate cooling water. The cooling water is configured to cool an electric device. The coolant circuit is configured to circulate a coolant. The coolant is configured to control a temperature of a cabin or a battery. The radiator is disposed in the water circuit. The heat exchanger is disposed in the coolant circuit and configured to receive heat released from the radiator through cooling air delivered from the radiator. The radiator fan is configured to adjust an amount of the cooling air passing through the radiator. The controller is configured to control the number of rotations of the radiator fan, and to increase the number of rotations of the radiator fan to a greater value in a condition where an increase in the temperature of the cabin or the battery is requested than in a normal condition where the increase in the temperature is not requested.

An aspect of the disclosure provides a method of controlling a temperature of an electric vehicle provided with a water circuit, a coolant circuit, a radiator, a heat exchanger, a water pump, and a radiator fan. The water circuit is configured to circulate cooling water that is configured to cool the electric device. The coolant circuit is configured to circulate a coolant that is configured to control a temperature of a cabin or a battery. The radiator is disposed in the water circuit. The heat exchanger is disposed in the coolant circuit and configured to receive heat released from the radiator through cooling air delivered from the radiator. The water pump is configured to regulate a flow rate of the cooling water circulating in the water circuit. The radiator fan is configured to adjust an amount of the cooling air passing through the radiator. The method includes: determining whether an increase in the temperature of the cabin or the battery is requested; controlling an operation of the water pump and the radiator fan both in a condition where the increase in the temperature is requested and in a normal condition where the increase in the temperature is not requested; and increasing an amount of heat to be transferred by the coolant circulating in the coolant circuit to a greater value by controlling one or both of the number of rotations of the water pump and the number of rotations of the radiator fan in the condition where the increase in the temperature is requested than in the normal condition.

BRIEF DESCRIPTION OF THE DRAWINGS

The accompanying drawings are included to provide a further understanding of the technology and are incorporated in and constitute a part of this specification. The drawings illustrate example embodiments and, together with the specification, serve to explain the principles of the technology.

DETAILED DESCRIPTION

Some embodiments of the disclosure will now be described with reference to the accompanying drawings. Note that the following description is directed to illustrative examples of the technology and not to be construed as limiting to the technology. Factors including, without limitation, numerical values, shapes, materials, components, positions of the components, and how the components are coupled to each other are illustrative only and not to be construed as limiting to the technology. Further, elements in the following example embodiments which are not recited in a most-generic independent claim of the technology are optional and may be provided on an as-needed basis. The drawings are schematic and are not intended to be drawn to scale. Throughout the present specification and the drawings, elements having substantially the same function and configuration are denoted with the same numerals to avoid any redundant description.

In an embodiment of the disclosure, an electric vehicle may be an automatic vehicle having vehicle wheels driven by an electric motor for traveling. Non-limiting examples of the electric vehicle in the present embodiment of the disclosure may include an electric vehicle provided with a battery as a power source, a fuel cell vehicle provided with a fuel battery as a power source, and a hybrid vehicle provided with a power engine, such as an internal combustion engine, along with an electric motor. The hybrid vehicle may include a plug-in hybrid vehicle.

Figure 1:
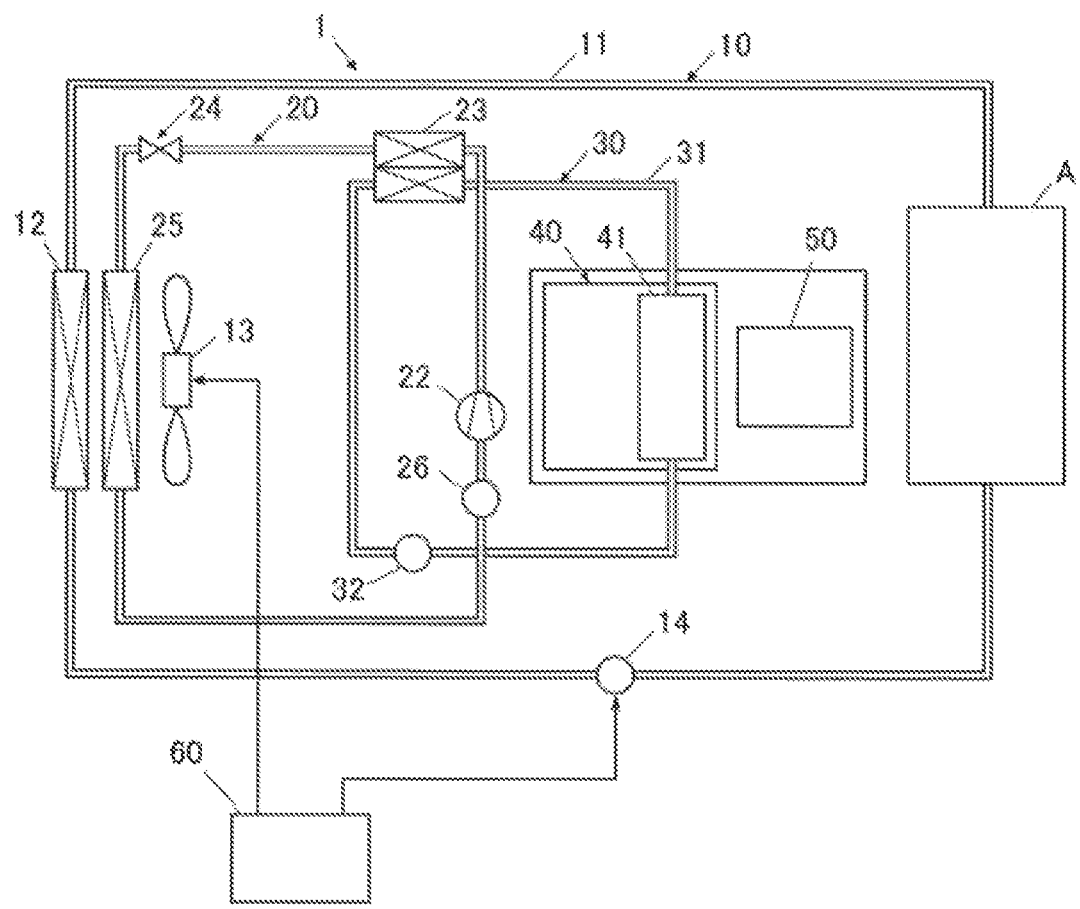
FIG. 1 is a schematic diagram of an example configuration of a temperature control system for an electric vehicle according to one embodiment of the disclosure.

FIG. 1 is a schematic diagram illustrating an example configuration of a temperature control system 1 for the electric vehicle (hereinafter simply referred to as temperature control system 1) according to the present embodiment of the disclosure. In FIG. 1, the left side of the page may correspond to a front side of the vehicle (i.e., a forward travel direction of the vehicle), and the right side of the page may correspond to a rear side of the vehicle (i.e., a rearward travel direction of the vehicle). Hereinafter, the description on directions may be made with reference to FIG. 1: A term "front side" may correspond to the left side of the page, and a term "rear side" may correspond to the right side of the page.

The temperature control system 1 according to the present embodiment of the disclosure includes a water circuit 10 and a coolant circuit 20. The water circuit 10 circulates a cooling water for cooling an electric device A. The electric device A may be a motor, an inverter, a DC/DC converter, or a charging device, for example. The coolant circuit 20 circulates a coolant for controlling the temperatures of a cabin and a battery 50 of the vehicle.

For example, the water circuit 10 is provided with a radiator 12. The radiator 12 may be disposed on a front side of the vehicle. The radiator 12 may dissipate or release heat from the cooling water 11 to the ambient air to cool the cooling water 11.

When an air flow generated by traveling of the vehicle is passing through the radiator 12, the radiator 12 may cool the cooling water 11 by dissipating heat from the cooling water 11 to the ambient air. In the present embodiment of the disclosure, a radiator fan 13 disposed on a rear side of the radiator 12 may be rotated to increase an air flow passing through the radiator 12 to improve efficiency in cooling the cooling water 11.

When the cooling water 11 cooled at the radiator 12 circulates in the water circuit 10 and reaches the electric device A, the cooling water 11 may absorb heat from the electric device A to cool the electric device A. The cooling water after cooling the electric device A may flow into the radiator 12, which dissipates heat from the cooling water 11. The process may be repeated in the water circuit 10 to cool the electric device A using the cooling water 11.

A water pump 14 is provided that circulates the cooling water 11 in the water circuit 10. The flow rate of the cooling water 11 circulating in the water circuit 10 may be regulated by controlling the number of the rotations of the water pump 14.

In the present embodiment of the disclosure, the temperature control system 1 includes a controller 60. The controller 60 may be a microcomputer, such as an electric control unit (ECU), that includes, for example, a central processing unit (CPU), a storage of various types, such as a ROM or RAM, and an input/output interface.

As illustrated in FIG. 1, the controller 60 may be coupled to at least the water pump 14 and the radiator fan 13 in the water circuit 10. The controller 60 controls the number of rotations $N14$ of the water pump 14 and the number of rotations $N13$ of the radiator fan 13.

In the present embodiment of the disclosure, the controller 60 may directly control the water pump 14 and the radiator fan 13. In an alternative embodiment of the disclosure, however, the water pump 14 and the radiator fan 13 may have respective controllers that are controlled by the controller 60.

Additionally, in the present embodiment of the disclosure, the controller 60 may control both of the number of rotations $N14$ of the water pump 14 and the number of rotations $N13$ of the radiator fan 13. In an alternative embodiment of the disclosure, however, the controller 60 may control either one of the number of rotations $N14$ of the water pump 14 and the number of rotations $N13$ of the radiator fan 13.

In the alternative embodiment of the disclosure where the controller 60 controls either one of the number of rotations $N14$ of the water pump 14 and the number of rotations $N13$ of the radiator fan 13, the control described below may be modified as appropriate to provide effective workings and effects that are similar to those in the present embodiment.

The temperature $T11$ of the cooling water 11 flowing in the water circuit 10 can increase with an increase in temperature of the electric device A.

For example, the flow rate of the cooling water 11 flowing into the radiator 12 may be increased by increasing the number of rotations $N14$ of the water pump 14. This may increase the amount of heat dissipated from the cooling water 11 in the radiator 12 per unit time, which improves efficiency in cooling the cooling water 11.

To this end, increasing the number of rotations $N14$ of the water pump 14 when the temperature $T11$ of the cooling water 11 increases with an increase in temperature of the electric device A helps to suppress a further increase in temperature of the electric device A or to cool the electric device A.

Figure 2:
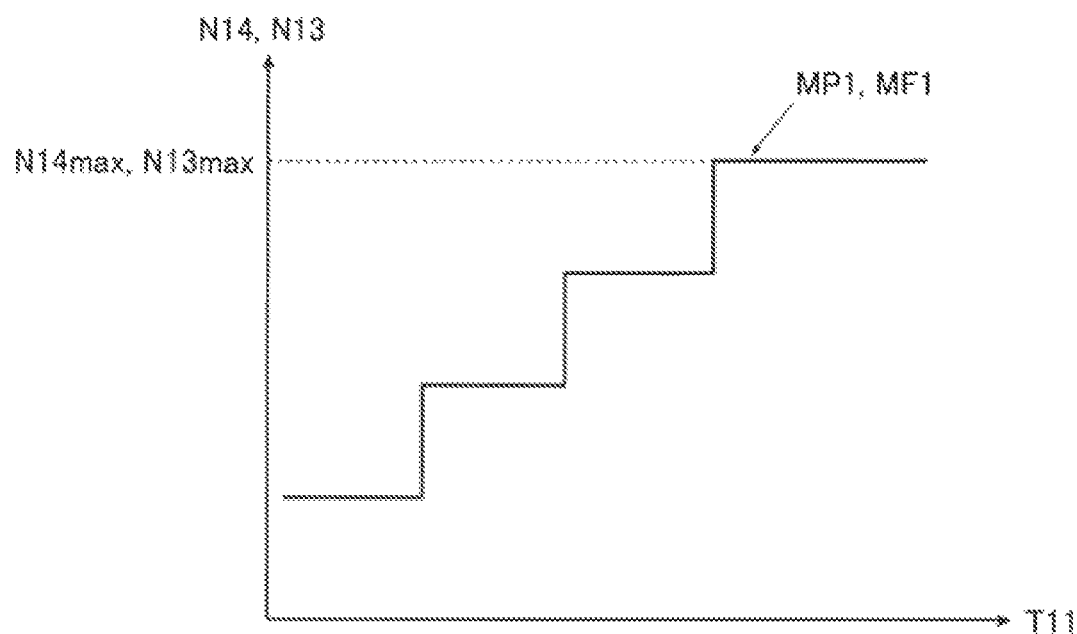
FIG. 2 is a graph illustrating examples of a first water-pump map and a first radiator-fan map according to one embodiment of the disclosure.

Accordingly, in the present embodiment of the disclosure, the controller 60 may have a first water-pump map MP1 illustrated in FIG. 2, for example. The controller 60 regulates the number of rotations $N14$ of the water pump 14 in accordance with the temperature $T11$ of the cooling water 11 on the basis of the first water-pump map MP1.

In the first water-pump map MP1 illustrated in FIG. 2, the number of rotations $N14$ of the water pump 14 may increase with an increase in temperature $T11$ of the cooling water 11, to suppress an increase in temperature of the electric device A or to cool the electric device A, as described above.

The reference characters "N14max" in FIG. 2 refers to a maximum rotation number of the water pump 14. The other reference characters, such as "N13" and "MF1", in FIG. 2 are described later.

In the example illustrated in FIG. 2, the number of rotations $N14$ of the water pump 14 may be increased stepwise with respect to the temperature $T11$ of the cooling water 11. In another example, however, the number of rotation $N14$ of the water pump 14 may be smoothly or linearly increased with respect to the temperature $T11$ of the cooling water 11. Optionally, in the embodiment where the number of rotations $N14$ is increased stepwise, an increment $\Delta N14$ of the number of rotations $N14$ or an interval $\Delta T11$ of the temperature $T11$ at which the number of rotations $N14$ is increased may be varied in accordance with an increase in the temperature $T11$.

The controller 60 may monitor the temperature T11 of the cooling water 11 through measurement by a sensor, for example. In one example, the controller 60 may constantly monitor the temperature T11 of the cooling water 11. In a normal condition where an increase in temperature of the cabin or the battery 50 is not requested (which will be described in detail later), the controller 60 may instruct the water pump 14 to rotate at the number of rotations N14 determined in accordance with the temperature T11 of the cooling water 11 on the basis of the first water-pump map MP1, thereby controlling the number of rotations N14 of the water pump 14.

For example, the amount of cooling air passing through the radiator 12 may be increased by increasing the number of rotations N13 of the radiator fan 13. This may increase the flow rate of the cooling water 11 exposed to the air in the radiator 12, which may increase the amount of heat released from the cooling water 11 at the radiator 12 per unit time. This improves efficiency in cooling the cooling water.

To this end, increasing the number of rotations N13 of the radiator fan 13 helps to suppress an increase in temperature of the electric device A or to cool the electric device A.

Accordingly, in the present embodiment of the disclosure, the controller 60 may have a first radiator-fan map MF1 illustrated in FIG. 2, for example. The controller 60 regulates the number of rotations N13 of the radiator fan 13 in accordance with the temperature T11 of the cooling water 11 on the basis of the first radiator-fan map MF1.

In the first radiator-fan map MF1, the number of rotations N13 of the radiator fan 13 may increase with an increase in the temperature T11 of the cooling water 11, as in the first water-pump map MP1. The reference characters "N13max" in FIG. 2 refers to a maximum rotation number of the radiator fan 13. In the example illustrated in FIG. 2, the number of rotations N13 of the radiator fan 13 may be increased stepwise with respect to the temperature T11 of the cooling water 11. It should be noted that this is a non-limiting example. In another example, the number of rotations N13 of the radiator fan 13 may be more smoothly or linearly increased. Optionally, an increment ΔN13 of the number of rotations N13 or an interval ΔT11 of the temperature T11 at which the number of rotations N13 is increased may be varied in accordance with an increase in the temperature T11.

The controller 60 may monitor the temperature T11 of the cooling water 11 through measurement by a sensor, for example. In one embodiment, the controller 60 may periodically monitor the temperature T11 of the cooling water 11. In the normal condition where the increase in temperature of the cabin or the battery 50 is not requested (which will be described in detail later), the controller 60 may instruct the radiator fan 13 to rotate at the number of rotations N13 determined in accordance with the temperature T11 of the cooling water 11 on the basis of the first radiator-fan map MF1, thereby controlling the number of rotations N13 of the radiator fan 13.

Alternatively, the controller 60 may perform the control of the number of rotations N14 of the water pump 14 based on the first water-pump map MP1 in parallel to the control of the number of rotations N13 of the radiator fan 13 based on the first radiator-fan map MF1. Still alternatively, the controller 60 may perform either one of the control of the number of rotations N14 and the control of the number of rotations N13. Yet still alternatively, the controller 60 may alternately perform the control of the number of rotations N14 and the control of the number of rotations N13.

In the present embodiment of the disclosure, the coolant circuit 20 may have a heat pump structure, as illustrated in FIG. 1. The coolant circuit 20 may supply heat to a heater 41 in the HVAC unit 40 to heat the heater 41 and may cool a non-illustrated evaporator. Note that illustration of the configuration for cooling the evaporator is omitted in FIG. 1.

For example, the coolant circuit 20 may include a compressor 22, a water-cooled condenser, an expansion valve 24, a heat exchanger 25, and an accumulator 26.

The compressor 22 may compress the coolant 21 in the coolant circuit 20 to increase the temperature of the coolant 21. Thereafter, the water-cooled condenser 23 may transfer heat from the coolant 21 at high temperature to a heat medium 31 in a heat medium circuit 30 to increase the temperature of the heat medium 31. The heat medium 31 may be delivered via the water pump 32 to the heater 41 in the HVAC unit 40 to heat the heater 41. The heater 41 may be thereby increased in temperature or kept at high temperature.

The coolant 21 having passed through the water-cooled condenser 23 may be rapidly decompressed and reduced in temperature at the expansion valve 24. The cooled coolant 21 may absorb or receive heat from the ambient air when passing through the heat exchanger 25.

The coolant 21 having received heat may be introduced into and once accumulated in the accumulator 26, and thereafter delivered to the compressor 22 again.

In this way, the coolant 21 in the coolant circuit 20 may absorb heat from the ambient air at the heat exchanger 25, and the heat may be transferred to the heat medium 31 in the heat medium circuit 30 at the water-cooled condenser 23, in the present embodiment. The heat of the heat medium 31 may warm up the heater 41 in the HVAC unit 40. The heater 41 may be thereby increased in temperature or kept at high temperature.

According to the present embodiment of the disclosure, the temperature of the cabin may be controlled by heating the air taken into the HVAC unit 40 or the air in the cabin by the heater 41 at high temperature in this way and delivering the heated air to the cabin.

Additionally, according to the present embodiment of the disclosure, the temperature of the battery 50 may be controlled (e.g., increased) by heating the battery 50 by the heater 41 in the HVAC unit 40.

For the electric vehicle including the HVAC unit having the heat pump structure, it can be difficult to increase the temperature of the cabin to a set temperature determined through an operation for increasing the temperature of the cabin by the occupant, for example, due to a large difference between the set temperature and an actual temperature of the cabin, in some cases. It can be also difficult to increase the temperature of the battery to a target temperature when needed due to a low temperature of the battery of the electric vehicle, in some cases. In such cases, there can be concerns that the occupant has to wait for an increase in temperature of the cabin or that it takes much time to cause the battery to exhibit a predetermined performance. In the present embodiment of the disclosure that addresses such concerns, it is possible to rapidly increase the temperature of one or both of the cabin and the battery, when needed.

As described above, the heat of the cooling water 11 in the water circuit 10 may be released at the radiator 12. Additionally, the coolant 21 in the coolant circuit 20 may receive heat when passing through the heat exchanger 25.

In the present embodiment, the heat exchanger 25 may be disposed rearward from the radiator 12 as illustrated in FIG.

1. Cooling air generated through traveling of the vehicle or rotation of the radiator fan 13 may pass through the radiator 12 in the water circuit 10 and then the heat exchanger 25 in the coolant circuit 20. The cooling air generated through the traveling of the vehicle or the rotation of the radiator fan 13 may deliver the heat released from the radiator 12 to the heat exchanger 25 disposed rearward or downstream, and the heat may be received by the coolant at the heat exchanger 25.

In the present embodiment of the disclosure in which the heat exchanger 25 is disposed rearward from the radiator 12, the heat released from the radiator 12 in the water circuit 10 may be received by the coolant at the heat exchanger 25 in the coolant circuit 20.

In the present embodiment in which the heat exchanger 25 in the coolant circuit 20 absorbs heat from the ambient air and the released heat from the radiator 12, it is possible to increase an amount of heat received by the coolant 21 in the coolant circuit 20, compared with a case in which the heat exchanger 25 in the coolant circuit 20 absorbs heat only from the ambient air.

Although not illustrated, in another embodiment of the disclosure, the arrangement of the heat exchanger 25 in the coolant circuit 20 and the radiator 12 may be inverted: The heat exchanger 25 may be disposed frontward (on the more left side in FIG. 1) from the radiator 12, depending on types of the vehicle.

In such an embodiment, the released heat from the radiator 12 may be delivered to the heat exchanger 25 disposed frontward from the radiator 12 by the air generated by the radiator fan 13, for example.

In the temperature control system 1 according to the present embodiment of the disclosure in which the released heat from the radiator 12 is received by the coolant at the heat exchanger 25, the controller 60 may increase the number of rotations N14 of the water pump 14 and the number of rotations N13 of the radiator fan 13 when an increase in temperature of the cabin or the battery 50 is requested That is, in the present embodiment, the controller 60 may control the number of rotations N14 of the water pump 14 and the number of rotations N13 of the radiator fan 13 in accordance with the temperature T11 of the cooling water 11 with reference to the first water-pump map MP1 and the first radiator-fan map MF1 in the normal condition where the increase in temperature of the cabin or the battery 50 is not requested, as described above. In contrast, the controller 60 may increase the number of rotations N14 of the water pump 14 and the number of rotations N13 of the radiator fan 13 to greater values with reference to other maps (described below) in a condition where the increase in temperature of the cabin or the battery 50 is requested (hereinafter also referred to as a "temperature increase request"), than in the normal condition where the number of rotations N14 of the water pump 14 and the number of rotations N13 of the radiator fan 13 are determined with reference to the first water-pump map MP1 and the first radiator-fan map MF1.

The increase in the number of rotations N14 of the water pump 14 may increase the flow rate of the cooling water 11 flowing in the water circuit 10 after being heated by the electric device A. Subsequent flow of the cooling water 11 into the radiator 12 may increase the amount of heat released from the radiator 12, which may increase the amount of heat received by the coolant 21 in the heat exchanger 25. Additionally, the increase in the number of rotations N13 of the radiator fan 13 may increase the amount of the ambient air containing the heat released from the radiator 12 and to be delivered to the heat exchanger 25, which may also increase the amount of heat received by the coolant 21 in the heat exchanger 25.

In this way, the amount of heat transferred by the coolant 21 through the coolant circuit 20 may increase with the increase in the amount of heat received by the coolant 21 in the heat exchanger 25, which may increase the amount of heat supplied from the coolant 21 via the water-cooled condenser 23 to the heater 41 in the HVAC unit 40.

The amount of heat supplied to the heater 41 in the HVAC unit 40 may be increased by increasing the number of rotations N14 of the water pump 14 and the number of rotations N13 of the radiator fan 13 under the control of the controller 60, as described above. Accordingly, it is possible to rapidly increase the temperature of the heater 41.

The temperature control system 1 according to the present embodiment of the disclosure, therefore, makes it possible to rapidly increase the temperatures of the cabin and the battery 50. Even if there is a large difference between an actual temperature of the cabin and a set temperature of the cabin determined through an operation for increasing the temperature of the cabin by the occupant, it is possible to rapidly increase the temperature of the cabin to the set temperature. Additionally, even if the battery 50 is at low temperature when the battery 50 is requested to increase in temperature, it is possible to rapidly heat the battery 50 to a target temperature using the heater 41.

Figure 3:
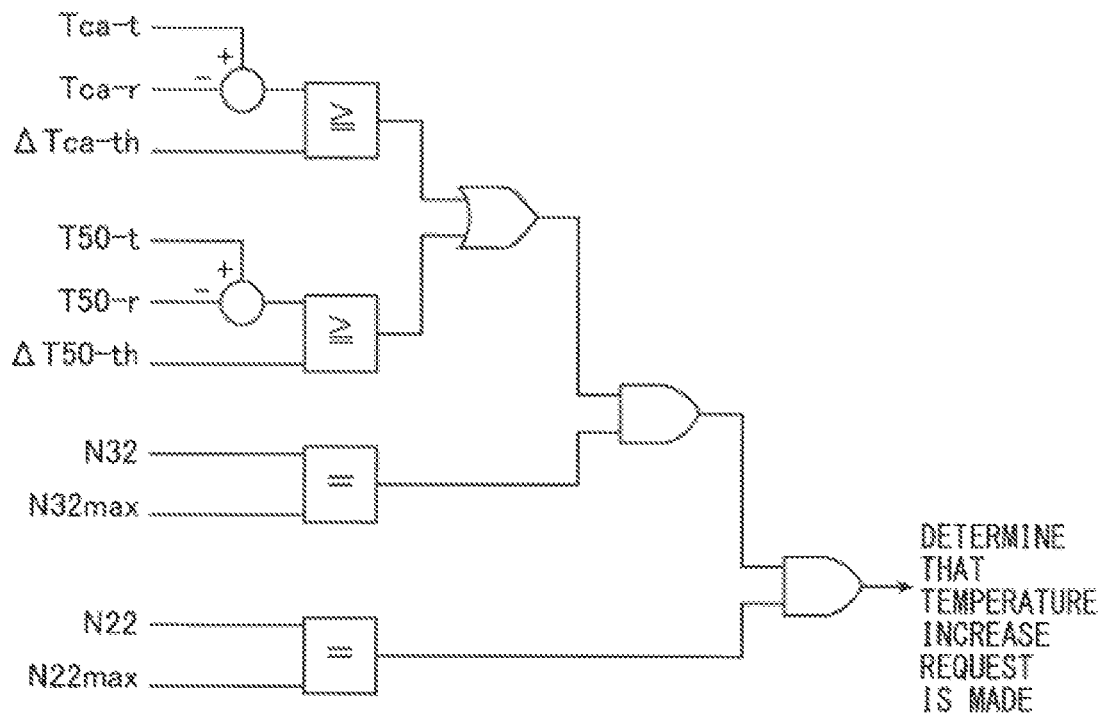
FIG. 3 is a schematic diagram illustrating example conditions for determining that an increase in temperature of a cabin or a battery is requested according to one embodiment of the disclosure.

In the present embodiment, the controller 60 may determine whether an increase in temperature of the cabin or the battery 50 is requested at every predetermined cycle. When the increase in temperature is requested, the controller 60 may increase the number of rotations N14 of the water pump 14 or the number of rotations N13 of the radiator fan 13. The controller 60 may determine that the temperature increase request to the cabin or the battery 50 is made when Condition 1-1 or Condition 1-2, Condition 2, and Condition 3 that are described below are all satisfied, as illustrated in FIG. 3. Note that the conditions described below are mere examples for purpose of explanation. Conditions for determining whether the temperature increase request is made may be appropriately selected and adjusted depending on the configuration or the control mechanism of the electric vehicle, for example.

Condition 1-1 is that a difference $\Delta T_{ca}$ ($=T_{ca-t}-T_{ca-r}$) between a target temperature (set temperature) $T_{ca-t}$ of the cabin and an actual temperature $T_{ca-r}$ of the cabin is equal to or greater than a differential temperature threshold $\Delta T_{ca-th}$. Condition 1-2 is that a difference $\Delta T_{50}$ ($=T_{50-t}-T_{50-r}$) between a target temperature (set temperature) $T_{50-t}$ of the battery 50 and an actual temperature $T_{50-r}$ of the battery 50 is equal to or greater than a differential temperature threshold $\Delta T_{50-th}$. In other words, Condition 1-1 is that the actual temperature of the cabin is lower than the target temperature of the cabin, and the difference therebetween is equal to or greater than the predetermined differential temperature threshold $\Delta T_{ca-th}$. Condition 1-2 is that the actual temperature of the battery 50 is lower than the target temperature of the battery 50, and the difference therebetween is equal to or greater than the predetermined differential temperature threshold $\Delta T_{50-th}$.

In an embodiment where the controller 60 controls both of the number of rotations N14 of the water pump 14 and the number of rotations N13 of the radiator fan 13, the controller 60 may determine that the temperature increase request is made when either one of Condition 1-1 and Condition 1-2 is satisfied. In another embodiment where the controller 60 controls either one of the number of rotations N14 of the water pump 14 and the number of rotation N13 of the radiator fan 13, the controller 60 may determine whether the temperature increase request is made on the basis of either one of Condition 1-1 and Condition 1-2.

Condition 2 is that the number of rotations N32 of the water pump 32 (illustrated in FIG. 1) in the heat medium circuit 30 has reached a maximum number of rotations N32max. In other words, Condition 2 is that the water pump 32 in the heat medium circuit 30 has been rotating at a full rotational speed.

Condition 3 is that the number of rotation N22 of the compressor 22 (illustrated in FIG. 1) in the coolant circuit 20 has reached a maximum number of rotations N22. In other words, Condition 3 is that the compressor 22 in the coolant circuit 20 has been rotating at a full rotational speed.

As described above, in the present embodiment of the disclosure, the controller 60 may determine that the temperature increase request to the cabin or the battery 50 is made when the actual temperature of the cabin or the battery 50 is lower than the target temperature by the differential temperature threshold or more even though the water pump 32 in the heat medium circuit 30 and the compressor 22 in the coolant circuit 20 have been rotating at a full rotation speed to increase the temperature of the heater 41 in the HVAC unit 40. When the temperature increase request is made, the controller 60 may increase the number of rotations of the water pump 14 or the number of rotations of the radiator fan 13 to increase the temperature of the heater 41. When the water pump 32 in the heat medium circuit 30 or the compressor 22 in the coolant circuit 20 has not reached the full rotation speed, the controller 60 may increase the number of rotation N32 of the water pump 32 or the number of rotations N22 of the compressor 22 to increase the temperature of the heater 41.

Alternatively, the temperature increase request to the cabin or the battery 50 may be determined by a circuit configuration. Still alternatively, the temperature increase request to the cabin or the battery 50 may be determined through a software program executed by the controller 60. Yet still alternatively, the temperature increase request to the cabin or the battery 50 may be determined by another controller, and the results of the determination may be sent to the controller 60.

Figure 4:
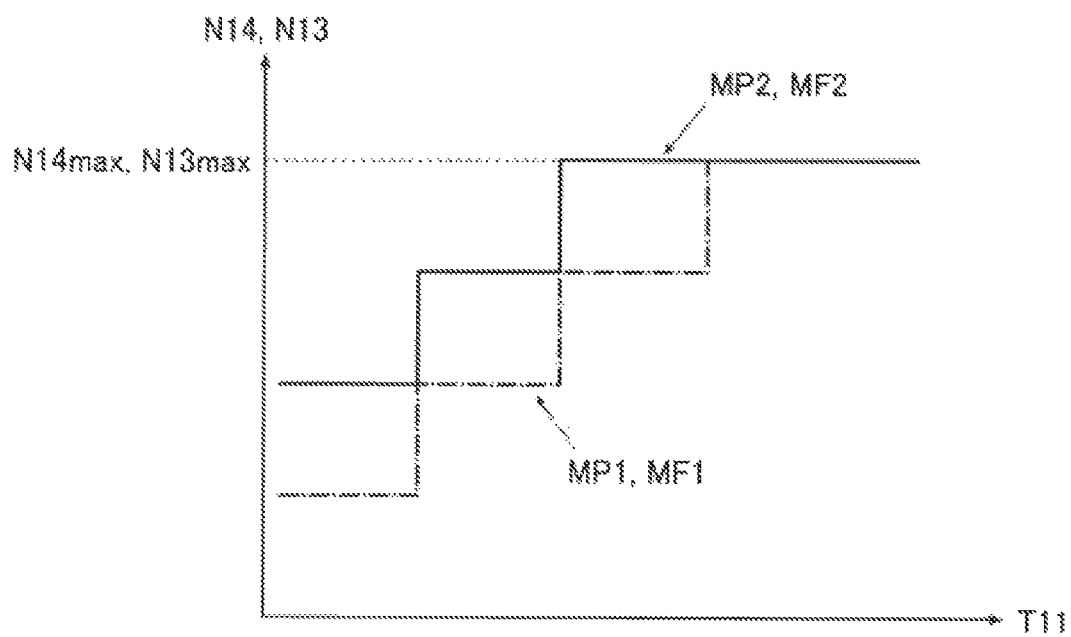
FIG. 4 is a graph illustrating examples of a second water-pump map and a second radiator-fan map according to one embodiment of the disclosure.

The controller 60 according to the present embodiment of the disclosure may further include a second water-pump map MP2 and a second radiator-fan map MF2 that are illustrated in FIG. 4, for example.

As in the first water-pump map MP1 and the first radiator-fan map MF1, the number of rotations N14 of the water pump 14 and the number of rotations N13 of the radiator fan 13 may be increased with an increase in the temperature T11 of the cooling water 11 in the second water-pump map MP2 and the second radiator-fan map MF2, as illustrated in FIG. 4. In the second water-pump map MP2 and the second radiator-fan map MF2, however, the number of rotations N14 of the water pump 14 and the number of rotation N13 of the radiator fan 13 before reaching the maximum rotation numbers N14max and the N13max may be set at greater values than in the first water-pump map MP1 and the first radiator-fan map MF1, at each temperature T11 of the cooling water 11. Note that the number of rotations N14 of the water pump 14 and the number of rotation N13 of the radiator fan 13 in the first water-pump map MP1 and the first radiator-fan map MF1 are represented by a chain line in FIG. 4.

As described above, when the temperature increase request to the cabin or the battery 50 is not made, the controller 60 may set the number of rotations N14 of the water pump 14 and the number of rotations N13 of the radiator fan 13 in accordance with the temperature T11 of the cooling water 11 on the basis of the first water-pump map MP1 and the first radiator-fan map MF1. The controller 60 may instruct the water pump 14 and the radiator fan 13 to rotate at the set number of rotations, thereby controlling the number of rotations N14 of the water pump 14 and the number of rotations N13 of the radiator fan 13. In contrast, when the temperature increase request to the cabin or the battery 50 is made, the controller 60 may set the number of rotations N14 of the water pump 14 and the number of rotations N13 of the radiator fan 13 in accordance with the temperature T11 of the cooling water 11 on the basis of the second water-pump map MP2 and the second radiator-fan map MF2. The controller 60 may instruct the water pump 14 and the radiator fan 13 to rotate at the set number of rotations, thereby controlling the number of rotations N14 of the water pump 14 and the number of rotations N13 of the radiator fan 13.

In this way, the number of rotations N14 of the water pump 14 and the number of rotations N13 of the radiator fan 13 may be increased to greater values when the temperature increase request to the cabin or the battery 50 is made (represented by a solid line in FIG. 4) than when the temperature increase request to the cabin or the battery 50 is not made (represented by the chain line in FIG. 4) in the present embodiment of the disclosure.

As described above, in the temperature control system 1 according to at least one of the embodiments of the disclosure, the controller 60 may increase the number of rotations N14 of the water pump 14 and the number of rotations N13 of the radiator fan 13 to greater values in a condition where the cabin or the battery 50 is requested to increase in temperature (i.e., the temperature increase request to the cabin or the battery 50 is made) than in the normal condition where the number of rotations N14 of the water pump 14 and the number of rotations N13 of the radiator fan 13 are set on the basis of the first water-pump map MP1 and the first radiator-fan map MF1.

Such an increase in the number of rotations N14 of the water pump 14 and the number of rotations N13 of the radiator fan 13 allows the coolant 21 in the heat exchanger 25 to receive a greater amount of the heat released from the radiator 12 than in the normal condition. This, in turn, increases the amount of heat supplied from the coolant 21 via the water-cooled condenser 23 to the heater 41 in the HVAC unit 40.

Accordingly, it is possible to rapidly increase the temperature of the heater 41 and the temperature of the cabin or the battery 50.

Even when there is a large difference between the set temperature of the cabin determined through an operation for increasing the temperature of the cabin by the occupant and the actual temperature of the cabin, it is possible to rapidly increase the temperature of the cabin to the set temperature.

Furthermore, even when the battery 50 is at low temperature when the battery 50 is requested to increase in temperature, it is possible to rapidly and appropriately heat the battery 50 to a target temperature using the heater 41.

As described above, according to at least one of the embodiments of the disclosure described above, it is possible to rapidly increase the temperature of the cabin or the battery when needed.

It should be understood that the foregoing embodiments are mere examples and are not intended to limit the scope of the technology. It should be also appreciated that various omissions, replacements, and modifications may be made in the foregoing embodiments described herein, without departing from the scope of the spirit of the technology. The technology is intended to include such modifications and alterations in so far as they fall within the scope of the appended claims or the equivalents thereof.

The invention claimed is:

1. A temperature control system to be installed in an electric vehicle, the temperature control system comprising:
   a water circuit configured to circulate cooling water, the cooling water being configured to cool an electric device;
   a coolant circuit configured to circulate a coolant, the coolant being configured to control a temperature of a cabin or a battery;
   a radiator disposed in the water circuit;
   a heat exchanger disposed in the coolant circuit and configured to receive heat released from the radiator through cooling air delivered from the radiator;
   a water pump configured to regulate a flow rate of the cooling water circulating in the water circuit; and
   a controller configured to
     control the number of rotations of the water pump, and
     increase the number of rotations of the water pump to a greater value in a condition where an increase in the temperature of the cabin or the battery is requested than in a normal condition where the increase in the temperature is not requested,
   wherein the controller includes:
     a first water-pump map that defines the number of rotations of the water pump depending on a temperature of the cooling water; and
     a second water-pump map that defines the number of rotations of the water pump, the number of rotations of the water pump defined by the second water-pump map being greater than the number of rotations of the water pump defined by the first water-pump map with respect to the temperature of the cooling water, and
   wherein the controller is configured to
     control the number of rotations of the water pump on a basis of the number of rotations retrieved from the first water-pump map in the normal condition, and
     control the number of rotations of the water pump on a basis of the number of rotations retrieved from the second water-pump map in the condition where the increase in the temperature of the cabin or the battery is requested.

2. The temperature control system according to claim 1, further comprising a radiator fan configured to adjust an amount of the cooling air passing through the radiator, wherein the controller is configured to
   control the number of rotations of the radiator fan and the number of rotations of the water pump, and
   increase one or both of the number of rotations of the water pump and the number of rotations of the radiator fan in the condition where the increase in the temperature of the cabin or the battery is requested.

3. The temperature control system according to claim 2, wherein
   the controller includes:
     a first radiator-fan map that defines the number of rotations of the radiator fan depending on a temperature of the cooling water; and
     a second radiator-fan map that defines the number of rotations of the radiator fan, the number of rotations of the radiator fan defined by the second radiator-fan map being greater than the number of rotations of the radiator fan defined by the first radiator-fan map with respect to the temperature of the cooling water, and
   the controller is configured to
     control the number of rotations of the radiator fan on a basis of the number of rotations retrieved from the first radiator-fan map in the normal condition, and
     control the number of rotations of the radiator fan on a basis of the number of rotations retrieved from the second radiator-fan map in the condition where the increase in the temperature of the cabin or the battery is requested.

4. A temperature control system to be installed in an electric vehicle, the temperature control system comprising:
   a water circuit configured to circulate cooling water, the cooling water being configured to cool an electric device;
   a coolant circuit configured to circulate a coolant, the coolant being configured to control a temperature of a cabin or a battery;
   a radiator disposed in the water circuit;
   a heat exchanger disposed in the coolant circuit and configured to receive heat released from the radiator through cooling air delivered from the radiator;
   a radiator fan configured to adjust an amount of the cooling air passing through the radiator; and
   a controller configured to
     control the number of rotations of the radiator fan, and
     increase the number of rotations of the radiator fan to a greater value in a condition where an increase in the temperature of the cabin or the battery is requested than in a normal condition where the increase in the temperature is not requested,
   wherein the controller includes:
     a first radiator-fan map that defines the number of rotations of the radiator fan depending on a temperature of the cooling water; and
     a second radiator-fan map that defines the number of rotations of the radiator fan, the number of rotations of the radiator fan defined by the second radiator-fan map being greater than the number of rotations of the radiator fan defined by the first radiator-fan map with respect to the temperature of the cooling water, and
   wherein the controller is configured to
     control the number of rotations of the radiator fan on a basis of the number of rotations retrieved from the first radiator-fan map in the normal condition, and
     control the number of rotations of the radiator fan on a basis of the number of rotations retrieved from the second radiator-fan map in the condition where the increase in the temperature of the cabin or the battery is requested.

5. A method of controlling a temperature of an electric vehicle provided with a water circuit, a coolant circuit, a radiator, a heat exchanger, a water pump, and a radiator fan,
   the water circuit being configured to circulate cooling water, the cooling water being configured to cool an electric device,
   the coolant circuit being configured to circulate a coolant, the coolant being configured to control a temperature of a cabin or a battery;
   the radiator being disposed in the water circuit,
   the heat exchanger being disposed in the coolant circuit and being configured to receive heat released from the radiator through cooling air delivered from the radiator, the water pump being configured to regulate a flow rate of the cooling water circulating in the water circuit, the radiator fan being configured to adjust an amount of the cooling air passing through the radiator, the method comprising:
- determining whether an increase in the temperature of the cabin or the battery is requested;
- controlling an operation of the water pump and the radiator fan both in a condition where the increase in the temperature is requested and in a normal condition where the increase in the temperature is not requested;
- increasing an amount of heat to be transferred by the coolant circulating in the coolant circuit to a greater value by controlling one or both of the number of rotations of the water pump and the number of rotations of the radiator fan in the condition where the increase in the temperature is requested than in the normal condition;
- controlling the number of rotations of the water pump on a basis of the number of rotations retrieved from a first water-pump map in the normal condition, wherein the first water-pump map defines the number of rotations of the water pump depending on a temperature of the cooling water; and
- controlling the number of rotations of the water pump on a basis of the number of rotations retrieved from a second water-pump map in the condition where the increase in the temperature of the cabin or the battery is requested, wherein the second water-pump map that defines the number of rotations of the water pump, the number of rotations of the water pump defined by the second water-pump map being greater than the number of rotations of the water pump defined by the first water-pump map with respect to the temperature of the cooling water.

* * * * *